United States Patent
Gutentag

(10) Patent No.: US 7,097,040 B1
(45) Date of Patent: Aug. 29, 2006

(54) ADHESIVE BACKED CARRIER TAPE WITH CALIBRATED LEVELS OF LOW TACK ADHESION FOR RETENTION OF SMALL COMPONENTS

(76) Inventor: Charles Gutentag, 8031 Okean Ter., Los Angeles, CA (US) 90046

( * ) Notice: Subject to any disclaimer, the term of this patent is extended or adjusted under 35 U.S.C. 154(b) by 0 days.

(21) Appl. No.: 11/198,669

(22) Filed: Aug. 5, 2005

(51) Int. Cl.
*B65D 73/02* (2006.01)
*B06D 85/30* (2006.01)

(52) U.S. Cl. .................. 206/714; 206/813; 206/460
(58) Field of Classification Search ............... 206/713, 206/715, 717, 722, 725, 460, 813, 714
See application file for complete search history.

(56) References Cited

U.S. PATENT DOCUMENTS

| | | | | |
|---|---|---|---|---|
| 3,608,711 A | * | 9/1971 | Wiesler et al. | 206/714 |
| 5,234,105 A | * | 8/1993 | Sato et al. | 206/706 |
| 5,648,136 A | * | 7/1997 | Bird | 428/76 |

* cited by examiner

*Primary Examiner*—Mickey Yu
*Assistant Examiner*—Jerrold Johnson

(57) ABSTRACT

An improvement in adhesive backed carrier tapes where the adhesion is substantially reduced by using a UV-sensitive adhesive tape which can be irradiated to reduce the adhesion within the compartment where each device will be placed. By reducing the initial aggressive adhesion levels minimally sufficient to retain devices securely as placed, the requirement for a lift pin or pushup pin to assist in removing the component can be eliminated. The principal benefits include substantial increase in throughputs and yields accompanied by proportionate cost reduction benefits.

21 Claims, 7 Drawing Sheets

ADHESIVE BACKED CARRIER TAPE WITH CALIBRATED LEVELS OF LOW TACK ADHESION FOR RETENTION OF SMALL COMPONENTS

BACKGROUND OF THE INVENTION

1. Field of the Invention

This invention relates to the field of packaging systems for automated component handling. Specifically, the present invention relates to carrier tape packaging systems utilizing pressure sensitive adhesive (PSA) tape for component retention. More particularly, the present invention incorporates calibrated levels of low tack adhesion within compartments of adhesive backed carrier tapes.

2. Description of the Prior Art

Three basic forms of carrier tape as defined by Industry Standards are presently utilized for packing a wide range of electronic components of varied shapes and sizes in tape and reel formats to facilitate automated processing and assembly handing of these devices. These basic forms of carrier tape are broadly defined by current Industry Standards as: Embossed; Punched; and Adhesive Backed.

Embossed Carrier Tape: (also known as pocket tape or blister tape) consists of a plurality of tub-like cavities formed in continuous lengths of plastic to fit the "3D" outline dimensions of each specific size and shape of device to be placed therein, then sealed for retention in the cavities by a top cover tape of continuous length.

Punched Carrier Tape: Comprises a plurality of rectangular-shaped holes pierced through continuous lengths of carrier material (typically paper). Holes are sized to fit the X-Y dimensions of devices to be placed therein and comprise cavities to retain components therein by dual cover tapes of continuous length, sealed to both sides of the punched carrier tape cavities.

Adhesive Backed Carrier Tape: Comprises a plurality of compartments of maximum practical size consistent with each industry standard carrier tape width, pierced through continuous lengths of carrier tape material (typically plastic) to which one or more strips at pressure sensitive adhesive tape are affixed to one side to provide an adhesive base within each compartment to retain components placed thereon.

None of the three aforesaid basic forms of carrier tapes offered for sale commercially provide viable solutions for high-speed automated handling of the proliferation of vanishingly small electronic components whose dimensions together with unit weight continue to diminish, seemingly without limit. The vast market for hand-held consumer electronics products such as mobile phones and PDAs with continuing customer demands for "smaller-lighter-more features and lower-cost" has driven reduction of component dimensions and resulting unit mass by orders of magnitude. Typical IC wafer die products in the early 1990's averaged 2 to 5 millimeters per side with thickness dimension of 0.5 to 0.6 millimeters. One decade later, the typical dimensions of functionally equivalent bare die have shrunk to 150 to 250 microns (6 to 10 mils) per side, (cut size) with 50 to 75 micron thickness dimensions. Even full-featured microprocessor die measuring 20 millimeters or more per side are becoming less than paper thin, by means of wafer back grinding, to enable requisite thermal control when in use. Unintended consequences of the foregoing "Sea Changes" in both size and resulting mass of electronic components in general and bare die products in particular include greater fragility of these devices which require further safeguards against damage during handling. In addition, the combination of micron-size footprints and thickness dimensions reduces the mass of each device to the extent that some of the smallest devices can literally defy Newton's Laws of Gravity, and in fact, frequently do so at automated component handling sites. Such particles constitute debris and airborne contamination within clean rooms where such automated component handling takes place and can cause serious injury to machine operators together with irreparable damage to adjacent work in process and processing machinery.

Limitations of present day commercially available carrier tapes to provide needed solutions for problems encountered during automated handling of extremely small low mass electronic components include all of the following:

Limitations of both embossed and punched carrier tapes with cover tapes sealed to retain components within individual cavities.

1. Peel back removal of carrier tape to open each cavity for component retrieval causes very small components to become disoriented within or be ejected from cavities, caused by forces induced by electrostatic discharge together with vibration of carrier tape due to uneven peel-back release of carrier tape from the carrier tape.

2. Inability to reduce cavity size to closely match dimensions of tiny components within to maintain component orientation, yet enable components to be removed by conventional pick tools.

3. Tendency of very thin devices to migrate to adjacent cavities during reeling and de-reeling of carrier tape. Many of those very thin devices will slide beneath the cover tape, which is not cross-sealed between cavities. This phenomenon is known as "Shingling"

Adhesive Backed Carrier Tapes

Pressure sensitive adhesive tape affixed as single or multiple strips to the backside of the component carrier tape must provide an optimum tape-to-component bond, which is minimally sufficient to hold devices securely during automated handling. Excessive adhesion (more than the minimum requirement) will impede rapid, unassisted separation of very small components, especially bare die products, from the adhesive tape backing, using commercially available pick tools for component retrieval and assembly placement.

The choices for adhesive backing tape acceptable for use with carrier tape to contain IC wafer die are limited to those which have been qualified and certified for use in processing IC wafers, and the bare die products singulated therefrom. This restriction is consistent with strict controls of all materials which come into contact with bare IC wafers and wafer die to avoid any measurable amount of contamination which could degrade or cause damage to fragile IC wafer die products. The commercially available pressure sensitive tapes which are qualified and certified for use with bare die vary in adhesive strength ratings. The selection of a minimum adhesive strength is governed by the over arching first requirement for adhesion strength which is sufficient to firmly secure the adhesive tape backing to the base carrier tape material to avoid subsequent de-lamination during reeling and de-reeling.

In point of fact, the minimum adhesion strength of backing tape which is sufficient to ensure its firm attached to the base carrier tape is substantially greater than the minimum adhesive bond strength required for retention of small IC wafer die in fixed repeatable position throughout the entire length of adhesive backed carrier tapes. Accordingly, bare die picked from wafers which have been diced on a solid matrix of qualified wafer dicing tape are individually picked from the dicing tape, assisted by one or more poke-up needles which penetrate the wafer dicing tape backing and rise in unison with the vacuum pick tool to enable separation from the aggressive adhesive dicing tape base.

Adhesive-backed carrier tape offers many advantages for handling these small light weight components and overcomes the major objections voiced by assembly users to conventional pocket tape and punched carrier tape with cover tape(s) for packing and handling extremely small low mass components. However, a major assembly user objection to present forms of adhesive backed carrier tape is the need for a lift pin in each tape feeder to assist the vacuum pick tool in removing each component from the adhesive backing. Such feeders with a lift pin are very costly when compared to feeders for conventional punched carrier tape or embossed pocket tape. In additional these feeders must be custom fitted to each Pick and Place machine platform and integrated with the host computer in order to function successfully. Cost and very limited availability of these special feeders has restricted acceptance of adhesive backed carrier tape to a limited number of high volume production applications.

There are major needs for improved adhesive backed carrier tapes which eliminate the need for a pushup pin or lift pins to assist in removing the component from adhesive backed carrier tape compartments and enable unaided pickup by conventional pick tools used on an automated pick and place assembly machines. There is a further need to provide a choice of predefined consistent low tack levels of adhesion in each compartment to optimize the component-to-tape bonding strength for a wide range of device types and sizes to ensure consistent repeatable capture and take away possession and placement of each device by conventional pick tools without damage to the devices.

SUMMARY OF THE INVENTION

The primary objective of the present invention is to provide an adhesive backed carrier tape, which is capable of retaining a wide range of component sizes and shapes (including extremely small components) in fixed repeatable locations within the carrier tape compartments. Of equal importance, the adhesive bond must allow ready removal of these components, without damage, by means of conventional pick tools, without need for a lift pin to assist in releasing the components from the adhesive. In this manner, tape feeders designed for use with conventional punched carrier tape can be utilized with components held in place within compartments with an adhesive backing. As previously described under Description of Prior Art, calibrated levels of adhesion are required to securely retain each device in its "as placed" position, yet allow ready removal when picked directly from adhesive backed carrier tape within compartments without a lift-pin assistance. Feeders for conventional punched carrier tapes are in abundance at circuit board assembly facilities and are well suited for use with calibrated low tack adhesive backed carrier tape. Another objective of the present invention is to present extremely small components or devices precisely and repeatably positioned at the Pick Point for 'blind pick' assembly, without need for machine vision, thereby substantially increasing both machine throughput as well as yields of finished product to minimize the need for costly rework. Another object of the present invention is to permit continued utilization of high-speed packaging machines which employ a walking beam together with the positioning combs to sweep quantities of tiny passive devices such as resistors and capacitors into the open top cavities of both punched and embossed carrier tape prior to application of cover tape. Here, the means for component transfer to adhesive backed carrier could remain essentially the same and the devices could be guided to the adhesive substrate by individual ducts to ensure uniform positioning.

A further objective of the present invention is to provide adhesive backed carrier tape with compartments of maximum size consistent with the dimensions of the carrier tape and its structural integrity requirements, so that a single carrier tape can accommodate a wide range of component sizes. Punched and embossed carrier tapes contain pre-sized cavities designed to fit a specific set of component dimensions. Accordingly, each variation in component size and shape may require a separate carrier tape with custom-sized cavities. This represents an additional cost to the component manufacturer and to the assembly user in order to obtain and maintain stocks of carrier tape on hand as needed, especially for bare die products for which no outline dimension industry standards have been established.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DETAILED DESCRIPTION OF THE PREFERRED EMBODIMENTS

Figure 1:
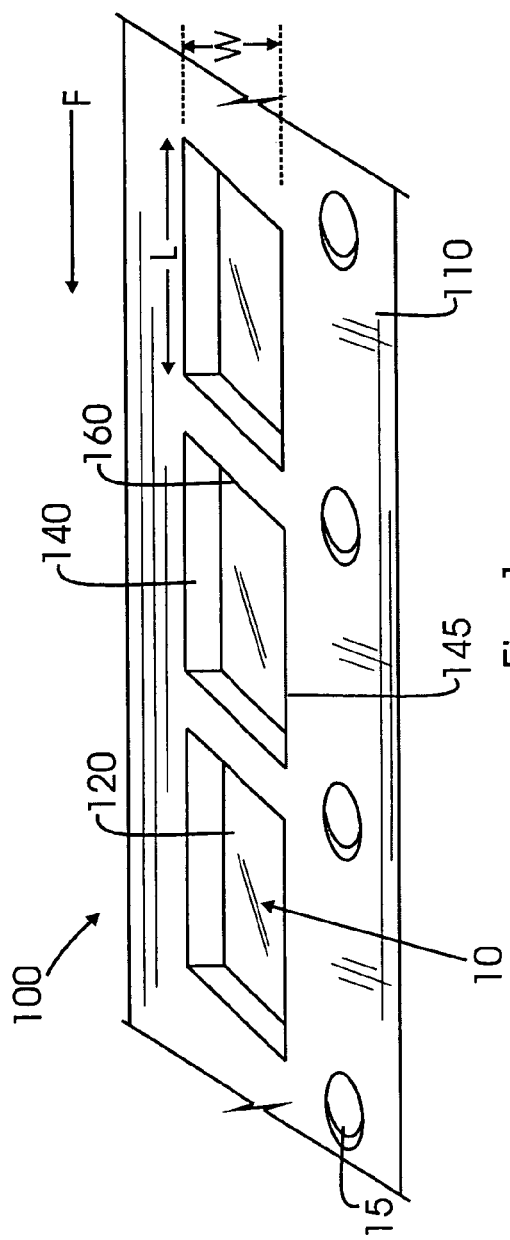
FIG. 1 is a perspective view of an adhesive backed carrier tape viewed from above, with the adhesive tape completely covering the interior lower area of each compartment.

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

The present invention is an improved adhesive backed continuous carrier tape, which eliminates the need for a lift pin or poke-up needle to assist in removing components from the adhesive tape based beneath compartments in the carrier tape. The improvements manifest in the present invention are achieved by utilizing a form of pressure sensitive adhesive tape (sold commercially UV-sensitive wafer dicing tape) with initial aggressive levels of adhesion which can be consistently and permanently reduced to predetermined levels at incremental spot locations only by exposure to ultraviolet (UV) radiation. Present day versions of adhesive backed carrier tape sold commercially utilize wafer dicing tapes with adhesive tack levels which are relatively uniform throughout continuous lengths and cannot be changed after lamination to the base carrier tape. Accordingly, the minimum level of adhesion at each compartment location where components are placed to achieve a tape-to-component bond is the same as the adhesion level required to ensure secure lamination of the adhesive backing tape to the carrier tape. In point of fact, this level of adhesion is much more aggressive than the minimum low tack adhesion needed to retain very small, light weight components within the adhesive based compartments, Accordingly, a lift pin or poke-up needle arrangement is needed to assist in releasing components from the adhesive substrate.

One version of adhesive backed carrier tape sold under the Registered Trademark name of SURFTAPE and protected by U.S. Pat. NO. 5,203,143 for Multiple and Split Pressure Sensitive Adhesive Stratums For Carrier Tape Packaging Systems which is incorporated herein by reference features split rails of non-UV sensitive adhesive tape to reduce the amount of adhesive surface exposed to each component. Useful for packaging larger devices to reduce total adhesion, the SURFTAPE approach continues the requirement for lift pins to release components from the adhesive backing tape.

The total solution to the problems aforesaid is achieved by reducing adhesion selectively at component placement sites only to extremely low tack levels which will suffice to retain components securely in position during reeling and de-reeling, yet enable ready release without damage, absent the need for lift pin assistance. Prior to UV radiation, the initial adhesive tack levels of UV-sensitive wafer dicing tapes approximate 500 to 700 grams per square centimeter. This aggressive adhesion is ideally suited to secure permanent attachment of the adhesive backing tape to the base carrier tape and avoid de-lamination during reeling and de-reeling. However, typical residual adhesive tack levels after radiation can be dramatically reduced to approximately 10 to 20 grams per square centimeter. This range of extremely low tack residual adhesion levels is within the range of adhesion needed for optimum tape to component bonding of small light weight devices, especially singulated bare wafer die: minimally sufficient to retain devices securely during reeling and de-reeling, yet enable retrieval by conventional pick tools without auxiliary lift pin assistance.

A further reduction in the effective low tack adhesion levels attainable by selective UV spot radiation at component placement sites only in accomplished by piercing the adhesive backing tape within compartments, using varied aperture shapes and sizes to limit the area of adhesive which contacts the device to achieve a tape to component bond. Multiple strips of UV-sensitive adhesive backing tape may be affixed to the carrier tape to provide voids in the adhesive tape surface which can bond to the component thereon. In addition, UV-sensitive adhesive backing tapes may be perforated when slit to width, using a pattern of small apertures of varied shapes and sizes to achieve predetermined further reductions in effective tape-to-component bonding, beyond that obtainable with UV radiation alone.

Referring to FIGS. 1 through 4, there is illustrated one preferred embodiment of the present invention. Referring to FIG. 1, there is shown a perspective view of the carrier tape 100, with a plurality of carrier tape compartments 10. The carrier tape 100 is a smooth ribbon like film, usually made of plastic type material. The carrier tape 100 has a plurality of carrier tape compartments 10 which form a hexahedron volume region. The length L, width W and depth D of an individual carrier tape compartment 10 is generally dependent on the pitch of the compartment to the sprocket drive holes 15 as well as the nature and thickness of the component to be placed within the compartment. The hexahedron volume region of the carrier tape compartment 10 constitutes a virtual boundary for component placement to enable placement of a multiplicity of device sizes within a compartment of fixed dimensions. The dimensions of said compartments should be maximized consistent with maintaining the structural integrity of the carrier tape itself. Other forms of commercially available adhesive backed carrier tapes offer compartments of 1.5×3.1 mm on carrier tapes 8 mm wide, while compartments of 22×32.4 mm are available on 44 mm wide carrier tapes.

Typical dimensions for the carrier tape 100 thickness D and resulting compartment depth range from 0.25 to 1.0 millimeter. The thickness D of the carrier tape 100 should be somewhat greater than the thickness of the small component, which is to be retained, to prevent damage and dislocation during subsequent handling.

The carrier tape 100 is used in automated manufacturing processes. Components are retained within compartments in the carrier tape. Continuous lengths of carrier tape with components are spooled onto reels. Tape with components are sequentially and repeatably indexed to a specific position or dead spot by the processing machinery, thereby accurately and repeatably feeding the carrier tape 100 forward.

The carrier tape has sprocket drive holes 15 which engage the teeth of a sprocket drive wheel or the latch of a lateral pawl of the processing machinery (typically, a tape feeder) to synchronize the indexing of the carrier tape 100 with the action of other processing machinery such as the vacuum probe of a pick and place machine. The direction of forward feed F, designated by an arrow at forward feed F, is the Industry Standard feed direction, which the carrier tape 100 moves during processing.

The carrier tape compartment 10 of the carrier tape 100 is typically a vacant hexahedron region, which has four enclosed sides. The four enclosed sides are: the left lateral side 140 and the right lateral side 145 which are lateral to the direction of forward feed F; and a trailing side 160 opposite to the direction of forward feed F. However, the geometry of the compartment could assume any convenient shape suitable for component retention, such as round or oval for example.

Figure 2:
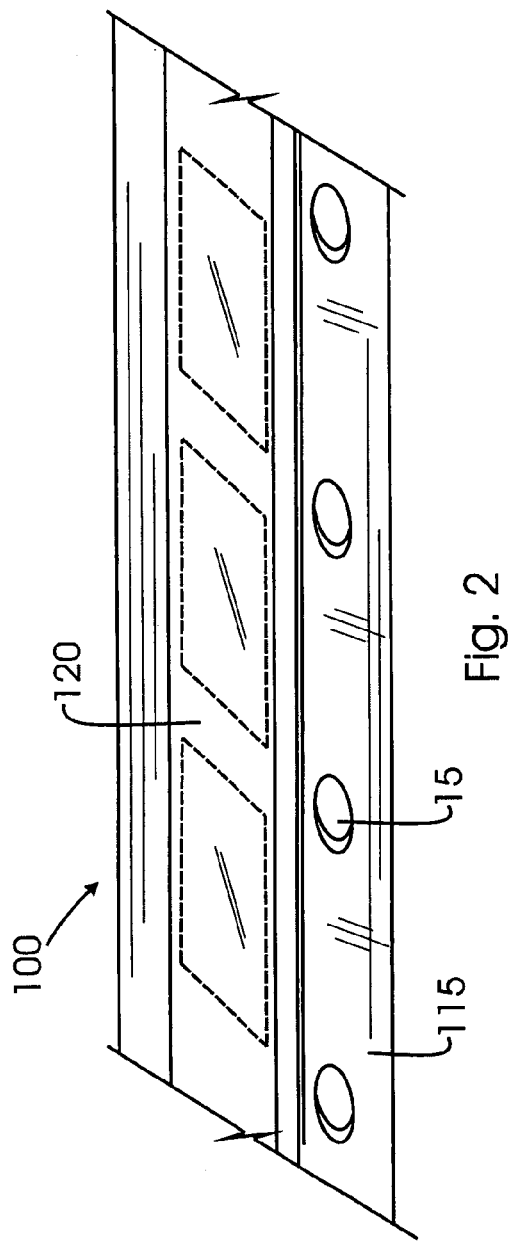
FIG. 2 is a perspective view of an adhesive backed carrier tape viewed from below, with the adhesive tape completely covering the interior lower area of each compartment.
Figure 3:
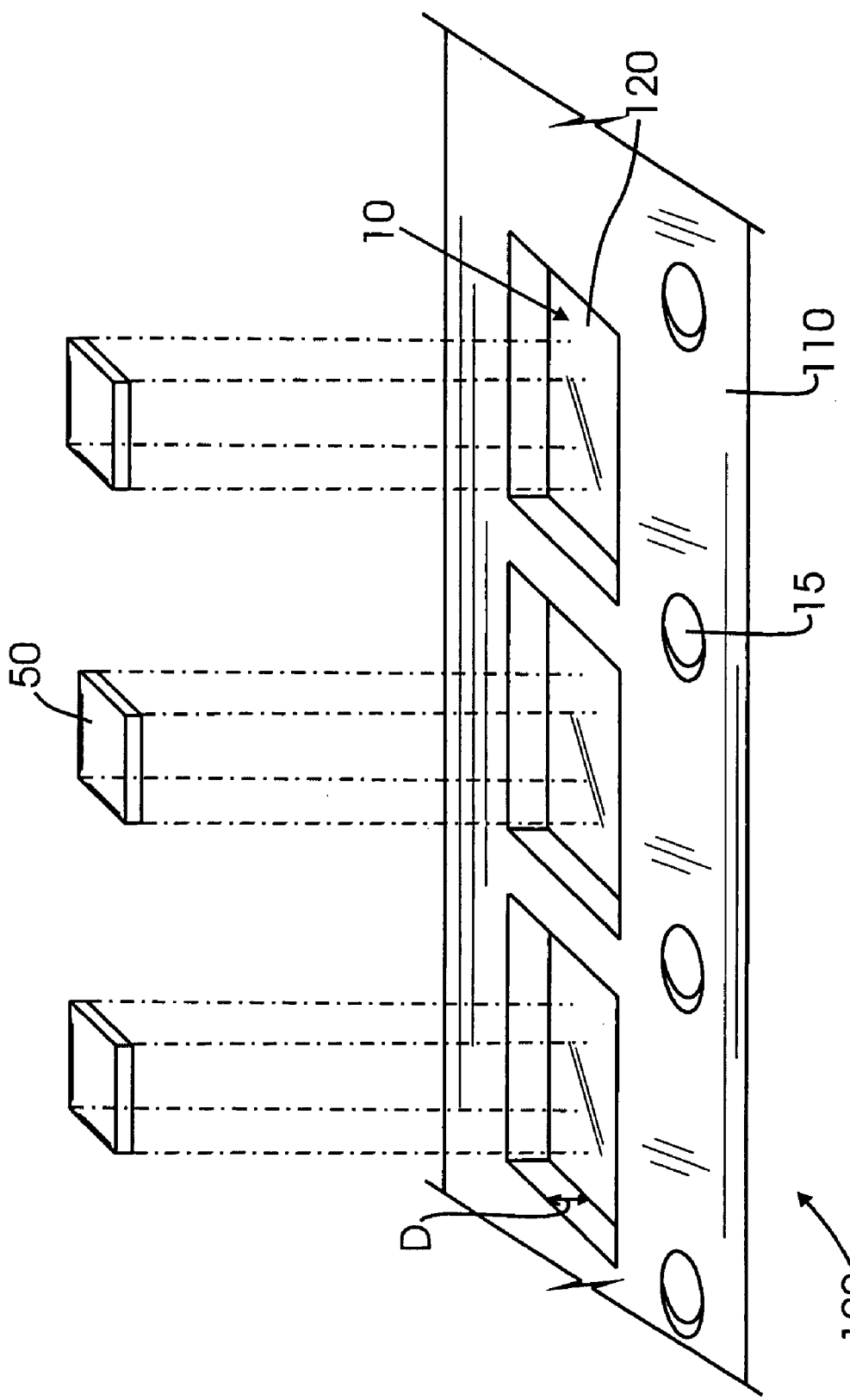
FIG. 3 is a perspective exploded view of the adhesive backed carrier tape, showing how a component will be placed in each compartment.

The carrier tape has an upper surface 110 and a lower surface 115. The carrier tape thickness is the same as the depth D of the carrier tape compartment 10. Affixed to the lower surface 115 is one or more lengths of pressure sensitive UV sensitive adhesive tape 120, which traverses the entire length of the lower surface 115 and is firmly affixed to the lower surface 115. Adhesion of the UV sensitive adhesive tape 120 prior to UV irradiation is very aggressive and is ideal to ensure that the adhesive backing tape will not de-laminate during the reeling and de-reeling sequences. As discussed above, it is a fundamental feature of the present invention to significantly reduce the adhesion of the UV sensitive adhesive tape within each compartment 10. By way of example, the carrier tape 100 with components in place may traverse linearly along a track or other mechanism such as a tape feeder with the carrier tape 100 face-up as illustrated in FIG. 1 or face down as illustrated in FIG. 2.

Figure 4:
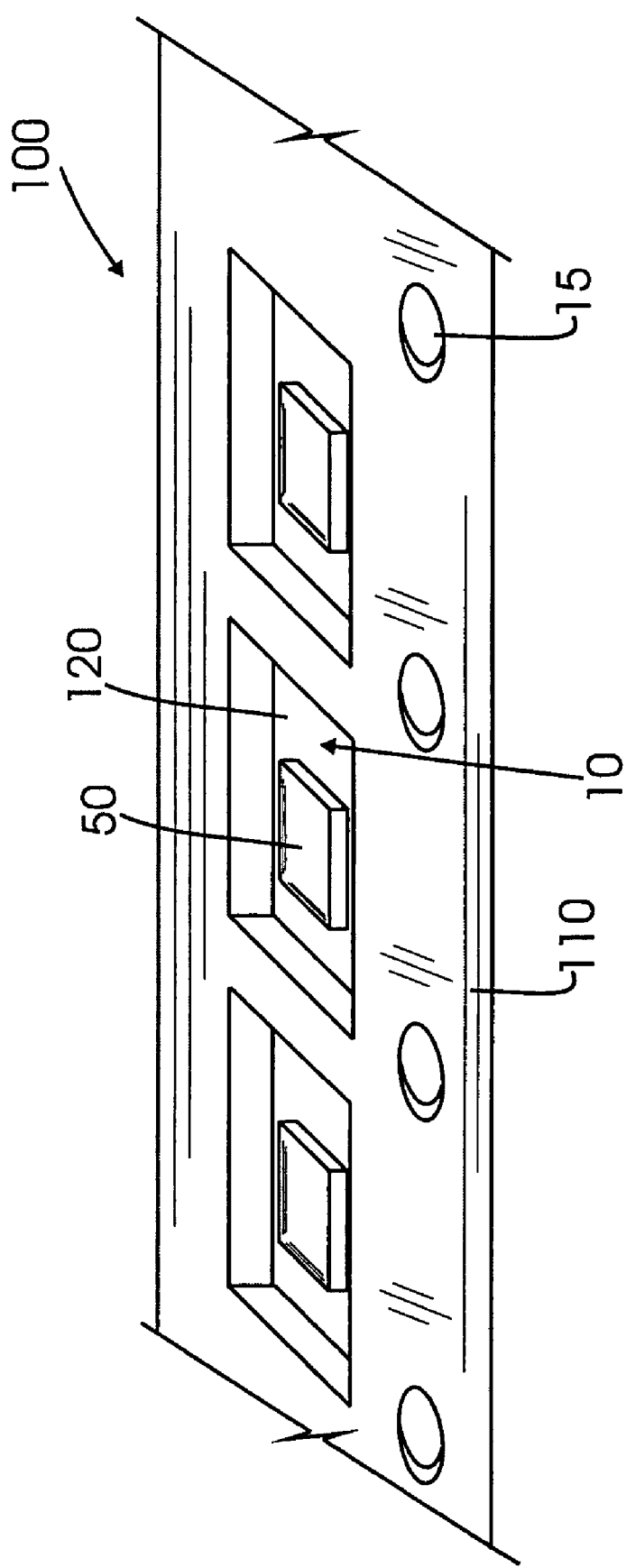
FIG. 4 is a perspective view of the adhesive backed carrier tape, with a component in place on the adhesive tape in each compartment.
Figure 5:
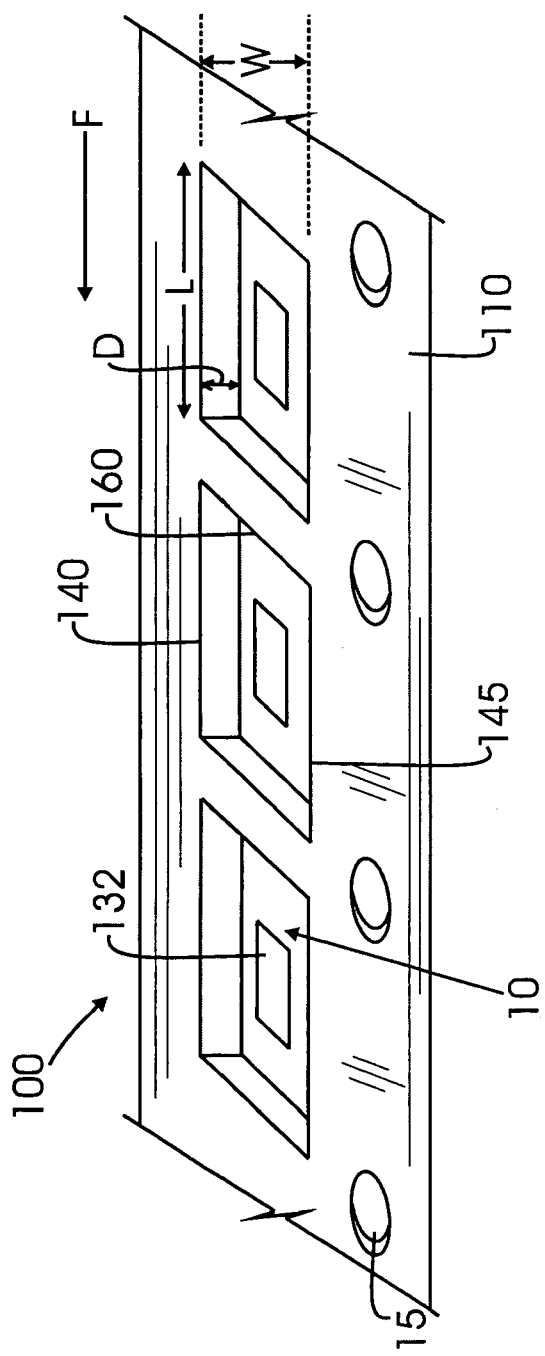
FIG. 5 is a perspective view of an adhesive backed carrier tape viewed from above, with the adhesive tape located in the interior lower area of each compartment and having a central through hole aperture in the adhesive tape.

Referring to FIGS. 4 and 5, at the central carrier tape compartments 10 a small component 50 is shown which fits within the carrier tape compartment 10 and is retained therein by the irradiated side of the UV sensitive adhesive tape 120 which has had its adhesion substantially reduced to achieve the aforementioned result of the present invention. In one popular application, small components 50 commonly held in this manner are integrated circuit wafer die, also described as tiny chip components.

In an alternative embodiment, illustrated in FIGS. 5 through 8, the amount of adhesion within each compartment is further reduced by piercing an aperture or opening 132 in the UV sensitive adhesive tape 130 in the approximate center location of each compartment 10. This aperture/opening will be sized and shaped in proportion to the dimensions of the device to be overlaid thereon, such as to reduce the surface area of the adhesive backing tape which can bond to the device. For example, piercing an aperture which represents 50 percent of the total surface area of the device placed precisely on the top of the aperture will achieve a proportionate reduction in the tape-to-component adhesive bond strength. Alternatively, there may be a multiplicity of apertures of varied shapes and sizes pierced in the UV sensitive tape portion within the compartment, arranged to further reduce the adhesive tape-to-component bond to facilitate removal of the device placed thereon.

Referring to FIGS. 5 through 8, affixed to the lower surface 115 is one or more lengths of pressure sensitive UV sensitive adhesive tape 130 which transverses the entire length of the lower surface 115 and is firmly affixed to the lower surface 115. Because the adhesion tack level of the UV sensitive adhesive tape 130 prior to UV irradiation is very aggressive, it will not de-laminate during the reeling and de-reeling sequences. A fundamental feature of the present invention to significantly reduce the adhesion of the UV sensitive adhesive tape within each compartment 10, while maintaining the original aggressive adhesive tack of the UV sensitive tape prior to irradiation to ensure a positive, permanent bond to the carrier tape lower surface 115.

The key feature of the present invention is obtaining and maintaining two widely difference levels of adhesion at defined locations throughout continuous lengths of UV sensitive adhesive tape used as the backing material for adhesive backed carrier tape. The result maintains original aggressive adhesion required to adhere to the carrier tape frame while reducing the adhesions level within each compartment 10 to a level slightly above zero, sufficient only to retain each component in position as placed during handling.

This result is achieved in two alternative ways. In the first alternative, a continuous carrier tape 100 such as illustrated in FIG. 1 of a given thickness and having a top side, a bottom side and a multiplicity of individual separated compartments formed therein each extending from the top side to the bottom side as previously discussed with reference to FIG. 1 is obtained and to the bottom 115 of this carrier tape is adhered a continuous UV-sensitive adhesive backing tape 120 so that the UV-sensitive adhesive tape 120 covers the entire bottom of each of the compartments 10 in the carrier tape 100. Initially, the UV-sensitive backing tape 120 has a first adhesion level which is of sufficient strength to cause the UV-sensitive adhesive tape to be firmly adhered to the bottom 115 of the continuous carrier tap 100 to thereby prevent de-lamination of the UV-sensitive adhesive tape from the bottom 115 of the continuous carrier tape 100 during use. After the UV-sensitive tape 120 is affixed to the carrier tape 100, the top side of the carrier tape is subjected to a controlled amount of ultraviolet radiation so that only the portion of the UV-sensitive adhesive tape within each compartment is irradiated. The top 110 of the carrier tape serves to shield that portion of the UV-sensitive adhesive tape which is affixed to the bottom 115 of the carrier tape 100. Through this controlled amount of ultraviolet radiation, the adhesion level of the UV-sensitive tape within each compartment 10 is reduced to a significantly lower level of adhesion while the shielded portion which adheres the UV-sensitive adhesive tape 120 to the carrier tape remains unaffected and retains its higher first level of adhesion. With the lower level of adhesion, the components 50 placed into each compartment as illustrated in FIG. 4 are retained by the reduced adhesion level UV-sensitive carrier tape in each compartment 10. The initial first adhesion level can by way of example be at least 300 grams per square centimeter and usually 500 to 700 grams per square centimeter and after irradiation, the portion of the UV-sensitive adhesive tape within each compartment 10 has its level of adhesion reduced to below 50 grams per square centimeter and levels of 10 to 20 grams per square centimeter can be achieved.

Figure 8:
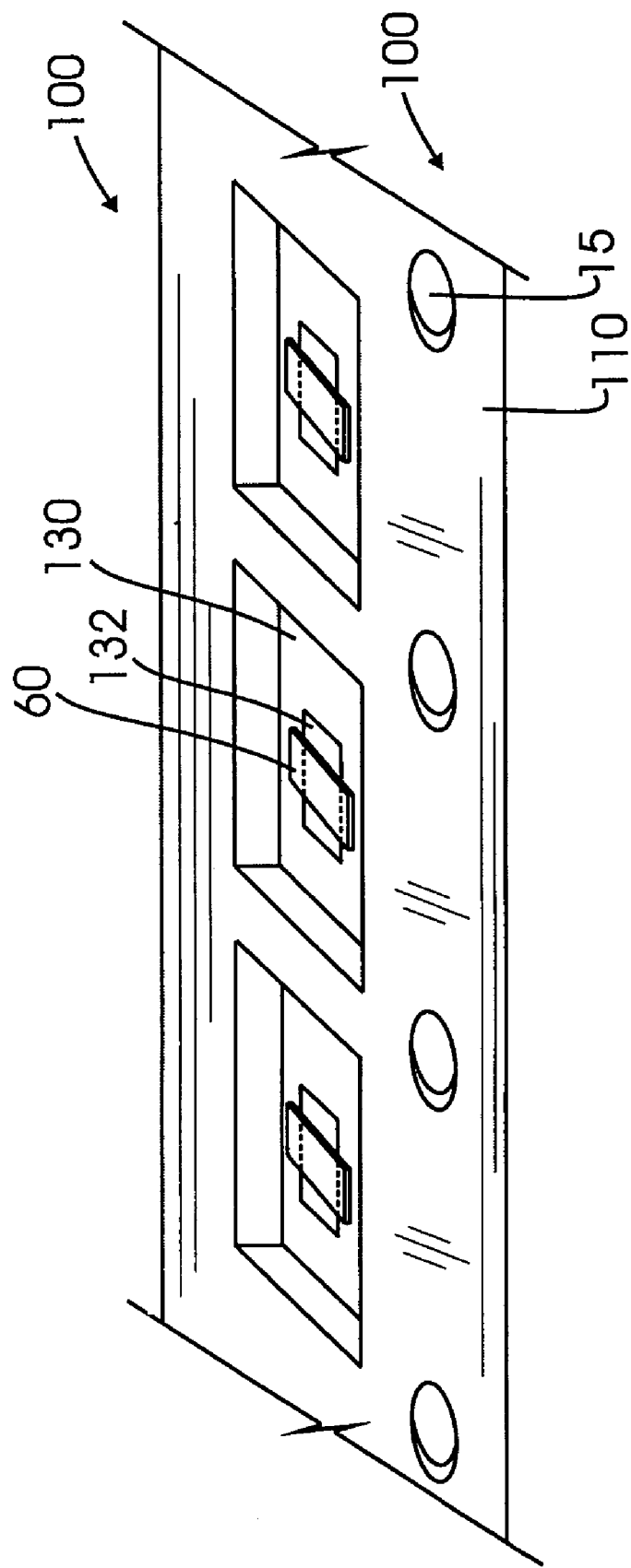
FIG. 8 is a perspective view of the adhesive backed carrier tape, with a component in place over the through hole aperture in the adhesive tape in each compartment.

In the second alternative, the adhesion level of the UV-sensitive carrier tape within each compartment can be further reduced by creating one or more through holes or apertures of various shapes at the location where a component will be retained so that there is less UV-sensitive adhesive tape to bond to the component 50 since as illustrated in FIG. 5 part of the component will lie over the through hole and only a portion of the component will be adhered to the UV-sensitive carrier tape 130. The through holes, one of which is illustrated as 132 in UV-sensitive adhesive tape 130 in FIG. 5 can be punched into the UV-sensitive adhesive tape after the UV-sensitive adhesive tape has been affixed to the carrier tape 100. Therefore, in this alternative, a continuous carrier tape 100 such as illustrated in FIG. 5 of a given thickness and having a top side, a bottom side and a multiplicity of individual separated compartments formed therein each extending from the stop side to the bottom side as previously discussed with reference to FIG. 1 is obtained and to the bottom 115 of this carrier tape is adhered a continuous UV-sensitive adhesive backing tape 130 so that the UV-sensitive adhesive tape 130 covers the entire bottom of each of the compartments 10 in the carrier tape 100. Initially, the UV-sensitive backing tape 130 has a first adhesion level which is of sufficient strength to cause the UV-sensitive adhesive tape to be firmly adhered to the bottom 115 of the continuous carrier tap 100 to thereby prevent de-lamination of the UV-sensitive adhesive tape from the bottom 115 of the continuous carrier tape 100 during use. After being affixed in this manner, at least one opening 132 may be created in a portion of the UV-sensitive adhesive tape to bond to the in each compartment 10 at the location where the component will be affixed. After the UV-sensitive tape 130 is affixed to the carrier tape 100 and the openings created in the UV-sensitive tape, the top side of the carrier tape is subjected to a controlled amount of ultraviolet radiation so that only the portion of the UV-sensitive adhesive tape within each compartment is irradiated. The top 110 of the carrier tape serves to shield the portion of the UV-sensitive adhesive tape which is affixed to the bottom 115 of the carrier tape 100. Through this controlled amount of ultraviolet radiation, the adhesion level of the UV-sensitive tape within each compartment 10 is reduced to a significantly lower level of adhesion while the shielded portion which adheres the UV-sensitive adhesive tape 130 to the carrier tape remains unaffected and retains its higher first level of adhesion. With the lower level of adhesion, the components 50 placed into each compartment as illustrated in FIG. 8 are retained by the reduced adhesion level UV-sensitive carrier tape in each compartment 10. The fact that the portion of a component 50 which lies over an opening 132 as illustrated in FIG. 8 cannot bond to the adhesive tape backing, results in a further reduction of total component-to-tape bonding. The initial first adhesion level can by way of example be at least 100 grams per square centimeter and usually 500 to 700 grams per square centimeter and after irradiation, the portion of the UV-sensitive adhesive tape within each compartment 10 has its level of adhesion reduced to below 50 grams per square centimeter and levels of 10 to 20 grams per square centimeter can be achieved. With the component 50 resting over the opening 132, less of the component surface is retained by the UV-sensitive adhesive tape so that the total adhesion level of the component is further reduced.

In one variation on the second alternative, the UV-sensitive adhesive tape 130 can be irradiated with ultraviolet radiation and the openings can be subsequently pierced through the irradiated UV-sensitive adhesive tape.

In another variation of the second alternative, a series of small apertures can be pierced through the UV-sensitive tape while it is being converted to specific widths by means of one or more rotary piercing die sets, thereby achieving a calibrated percentage reduction in the total adhesive tack level of the UV-sensitive tape tack level both before and after irradiation. Such pre-perforation will be controlled to retain a first level adhesion after piercing to ensure a secure bond to carrier tape back surface 115, yet will enable substantially lower levels of adhesion within compartments after radiation from the top side of the carrier tape 110.

Figure 6:
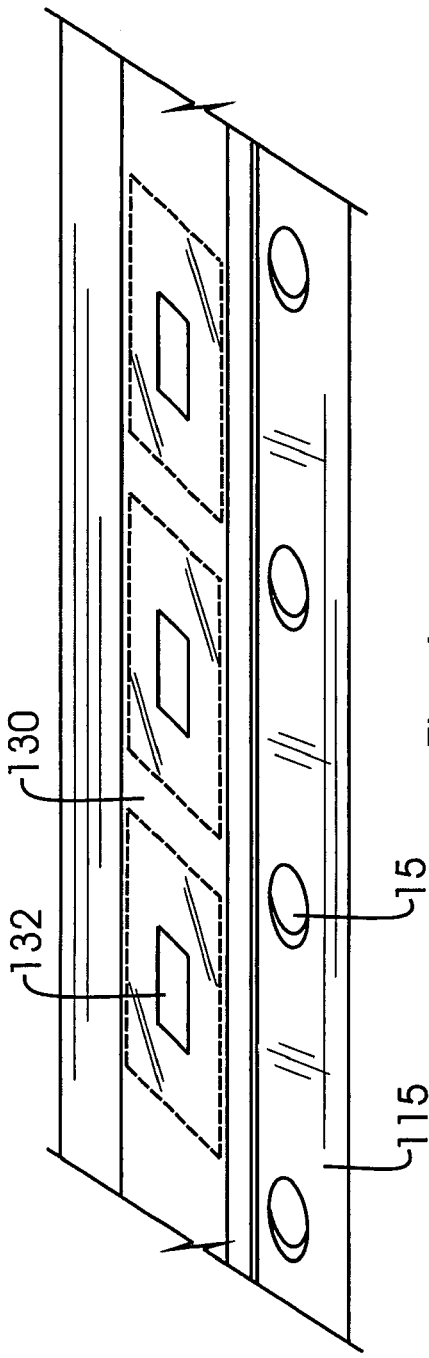
FIG. 6 is a perspective view of an adhesive backed carrier tape viewed from below, with the adhesive tape located in the interior lower area of each compartment and having a central through hole aperture in the adhesive tape.
Figure 7:
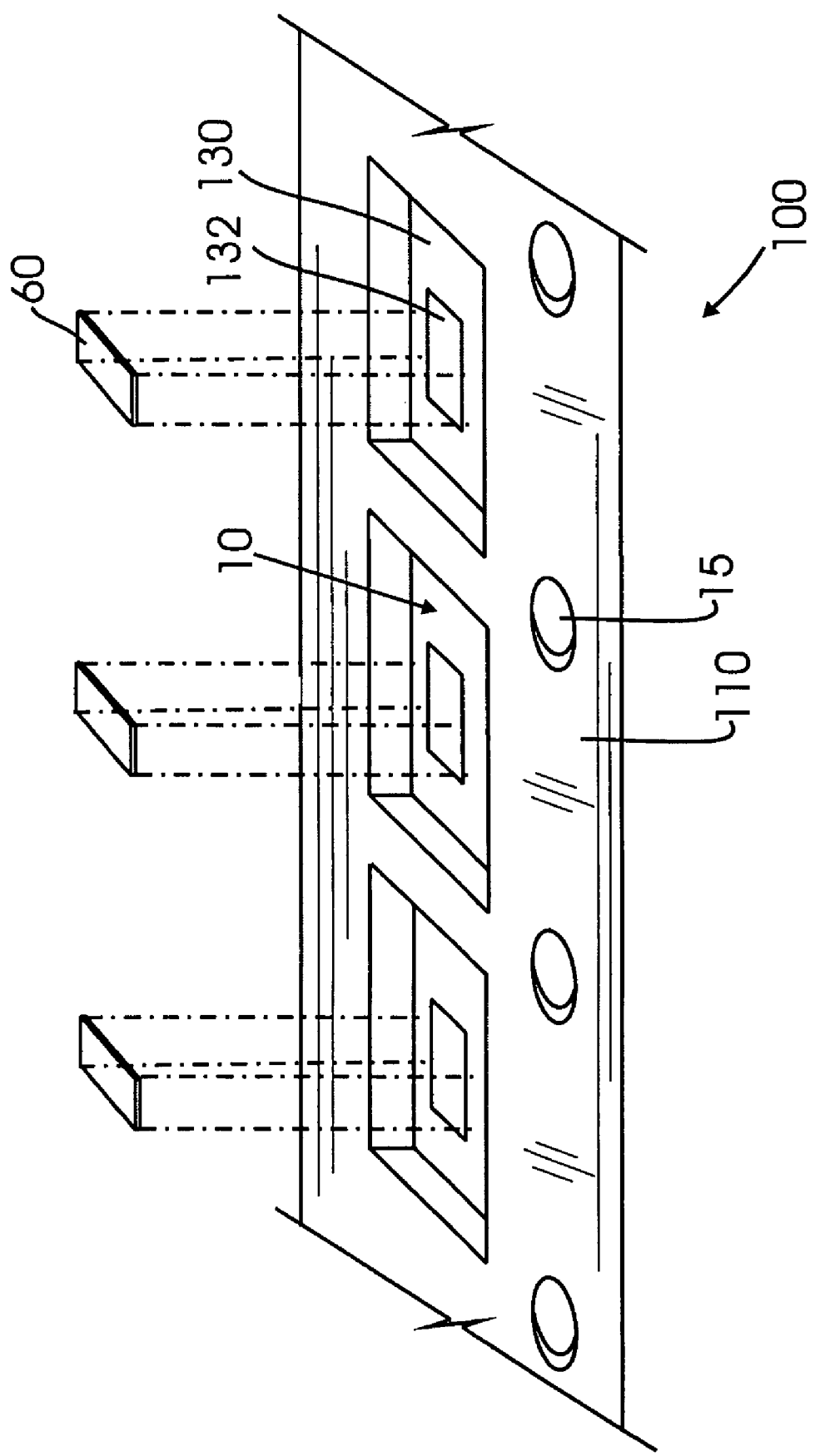
FIG. 7 is a perspective exploded view of the adhesive backed carrier tape, showing how a component will be placed in each compartment.
Figure 9A:
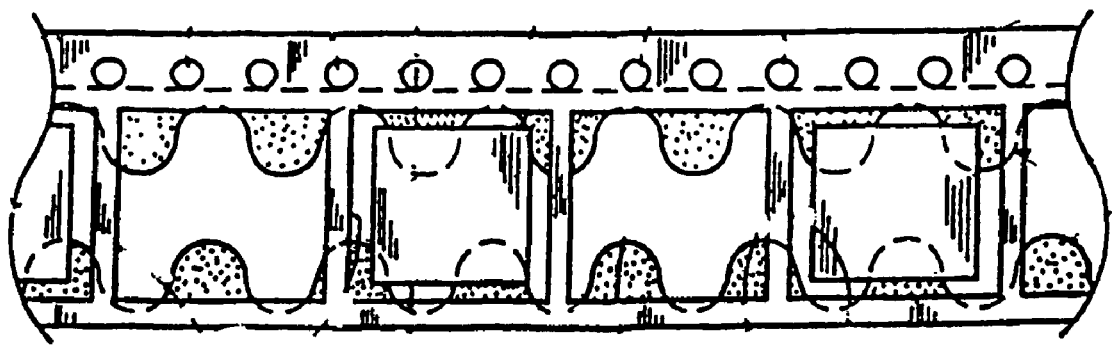
FIG. 9 is an illustration of types of through hole designs which can be utilized with the present invention to further selectively reduce the adhesion level of the UV-sensitive adhesive tape.
Figure 9B:
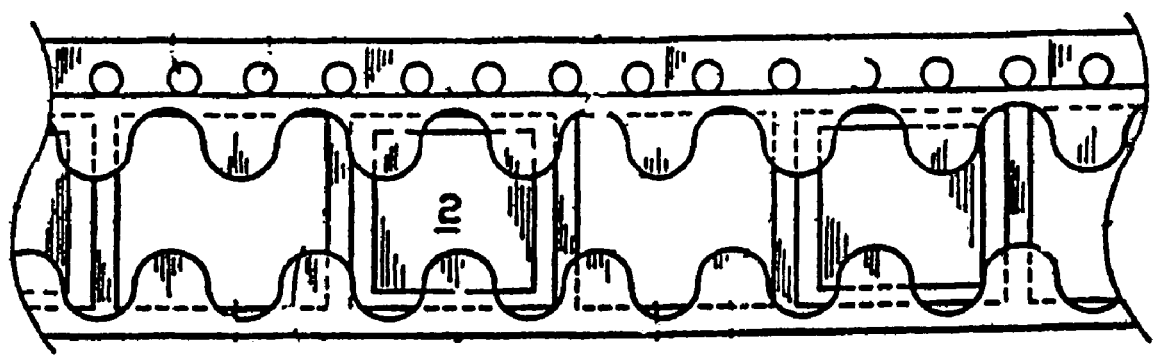

The shape of the openings 132 can be any desired shape to accommodate the specific component. Referring to FIGS. 9A and 9B, shapes of openings can be illustrated including a wave shape of various configurations as illustrated originally in FIGS. 1, 2, of U.S. Pat. No. 6,357,594. Other shapes such as a jagged shape as illustrated in FIG. 6 of U.S. Pat. No. 6,357,594; a multiplicity of holes as illustrated in FIGS. 11 and 13 of U.S. Pat. No. 6,357,594, a tooth shape as illustrated in FIG. 10 of U.S. Pat. No. 6,537,594; a double wavy line as illustrated in FIG. 12 of U.S. Pat. No. 6,357,594; split railed as illustrated in FIG. 14 of U.S. Pat. No. 6,357,594 and square, rectangular or large circular openings as respectively illustrated in FIGS. 6, 8, 7 and 9 of U.S. Pat. No. 5,524,765.

Defined in detail, the present invention is a method for altering an adhesion level used to retain a component within one or more individual compartments of a continuous adhesive backed carrier tape, the method comprising the steps of: (a) obtaining a continuous carrier tape of a given thickness and having a top side, a bottom side, and a multiplicity of individual separated compartments formed therein each extending from the top side to the bottom side and adhering a continuous UV-sensitive adhesion tape to the bottom side so that the continuous UV-sensitive adhesion tape covers the entire bottom of each of the compartments, the UV-sensitive adhesion tape having a first adhesion level of sufficient strength to cause the UV-sensitive adhesion tape to be firmly adhered to the bottom of the continuous carrier tape to thereby prevent de-lamination of the UV-sensitive adhesive tape from the continuous carrier tape during use; and (b) subjecting the top side of the continuous carrier tape to a controlled amount of ultraviolet radiation so that only that portion of the UV-sensitive adhesive tape within each compartment is irradiated while the portion of the UV-sensitive adhesive tape which is affixed to the carrier tape is shielded from the ultraviolet radiation, to thereby reduce the adhesion level of the UV-sensitive adhesive tape within each compartment to a second lower level of adhesion.

Defined broadly, the present invention is a method for altering an adhesion level used to retain a component within one or more individual compartments of a continuous adhesive backed carrier tape, the method comprising the steps of: (a) obtaining a continuous carrier tape of a given thickness and having a top side, a bottom side, and a multiplicity of individual separated compartments formed therein each extending from the top side to the bottom side and adhering a continuous UV-sensitive adhesive tape to the bottom side so that the continuous UV-sensitive adhesive tape covers the entire bottom of each of the compartments, the UV-sensitive adhesive tape having a first adhesion level of sufficient strength to cause the UV-sensitive adhesive tape to be firmly adhered to the bottom of the continuous carrier tape to thereby prevent de-lamination of the UV-sensitive adhesive tape from the continuous carrier tape during use; (b) indexing the UV-sensitive adhesive backed carrier tape through a tape punching mechanism equipped with piercing dies to introduce at least one opening in the UV-sensitive adhesive tape in each compartment at a location where a component will be placed to thereby further reduce the resulting tape-to-component bond to a calibrated level minimized to enable retention of the component as placed yet enabling removal without use of a lift pin to assist a component pick tool; and (c) subjecting the top side of the continuous carrier tape to a controlled amount of ultraviolet radiation so that only that portion of the UV-sensitive adhesive tape within each compartment is irradiated while the portion of the UV-sensitive adhesive tape which is affixed to the carrier tape is shielded from the ultraviolet radiation, to thereby reduce the adhesion level of the UV-sensitive adhesive tape within each compartment to a second lower level of adhesion.

Defined more broadly, the present invention is a method for altering an adhesion level used to retain a component within one or more individual compartments of a continuous adhesive backed carrier tape, the method comprising the steps of: (a) obtaining a continuous carrier tape of a given thickness and having a top side, a bottom side, and a multiplicity of individual separated compartments formed therein each extending from the top side to the bottom side and adhering a continuous UV-sensitive adhesive tape to the bottom side so that the continuous UV-sensitive adhesive tape covers the entire bottom of each of the compartments, the UV-sensitive adhesive tape having a first adhesion level of sufficient strength to cause the UV-sensitive adhesive tape to be firmly adhered to the bottom of the continuous carrier tape to thereby prevent de-lamination of the UV-sensitive adhesive tape from the continuous carrier tape during use; (b) subjecting the top side of the continuous carrier tape to a controlled amount of ultraviolet radiation so that only that portion of the UV-sensitive adhesive tape within each compartment is irradiated while the portion of the UV-sensitive adhesive tape which is affixed to the carrier tape is shielded from the ultraviolet radiation, to thereby reduce the adhesion level of the UV-sensitive adhesive tape within each compartment to a second lower level of adhesion; and (c) indexing the irradiated UV-sensitive adhesive backed carrier tape through a tape punching mechanism equipped with piercing dies to introduce at least one opening in the irradiated UV-sensitive adhesive tape in each compartment at a location where a component will be placed to thereby further reduce the resulting tape-to-component bond to a calibrated level minimized to enable retention of the component as placed yet enabling removal without use of a lift pin to assist a component pick tool Defined even more broadly, the present invention is a method for altering an adhesion level used to retain a component within one or more individual compartments of a continuous adhesive backed carrier tape, the method comprising the steps of: (a) obtaining a continuous carrier tape of a given thickness and having a top side, a bottom side, and a multiplicity of individual separated compartments formed therein each extending from the top side to the bottom side and adhering a continuous UV-sensitive adhesive tape to the bottom side so that the continuous UV-sensitive adhesive tape covers the entire bottom of each of the compartments, the UV-sensitive adhesive tape having a first adhesion level of sufficient strength to cause the UV-sensitive adhesive tape to be firmly adhered to the bottom of the continuous carrier tape to thereby prevent de-lamination of the UV-sensitive adhesive tape from the continuous carrier tape during use; (b) subjecting the top side of the continuous carrier tape to a controlled amount of ultraviolet radiation so that only that portion of the UV-sensitive adhesive tape within each compartment is irradiated while the portion of the UV-sensitive adhesive tape which is affixed to the carrier tape is shielded from the ultraviolet radiation, to thereby reduce the adhesion level of the UV-sensitive adhesive tape within each compartment to a second lower level of adhesion; and (c) indexing the irradiated UV-sensitive adhesive backed carrier tape through a tape punching mechanism equipped with piercing dies to introduce at least one opening in the irradiated UV-sensitive adhesive tape in each compartment at a location where a component will be placed to thereby further reduce the resulting tape-to-component bond to a calibrated level minimized to enable retention of the component as placed yet enabling removal without use of a lift pin to assist a component pick tool.

Defined even more broadly, the present invention is a method for altering an adhesion level used to retain a component within one or more individual compartments of a continuous adhesive backed carrier tape, the method comprising the steps of: (a) obtaining a continuous carrier tape of a given thickness and having a top side, a bottom side, and a multiplicity of individual separated compartments formed therein each extending from the top side to the bottom side; (b) obtaining a continuous UV-sensitive adhesive tape which has been perforated with a screen pattern of small uniformly spaced holes which serve to remove portions of the adhesive materials from the UV-sensitive adhesive tape and thereby reduce the rated adhesion of the UV-sensitive adhesive tape by a calculated percentage; (c) adhering the perforated continuous UV-sensitive tape to the bottom side of the carrier tape so that the continuous UV-sensitive adhesive tape covers the entire bottom of each of the compartments, the UV-sensitive adhesive tape having a first adhesion level of sufficient strength to cause the UV-sensitive adhesive tape to be firmly adhered to the bottom of the continuous carrier tape to thereby prevent de-lamination of the UV-sensitive adhesive tape from the continuous carrier tape during use; and (d) subjecting the top side of the continuous carrier tape to a controlled amount of ultraviolet radiation so that only that portion of the UV-sensitive adhesive tape within each compartment is irradiated while the portion of the UV-sensitive adhesive tape which is affixed to the carrier tape is shielded from the ultraviolet radiation, to thereby reduce the adhesion level of the UV-sensitive adhesive tape within each compartment to a second lower level of adhesion.

Defined even more broadly, the present invention is a carrier tape comprising: (a) a continuous carrier tape of a given thickness and having a top side, a bottom side, and a multiplicity of individual separated compartments formed therein each extending from the top side to the bottom side and having adhered to the bottom side a continuous UV-sensitive adhesive tape so that the continuous UV-sensitive adhesive tape covers the entire bottom of each of the compartments, the UV-sensitive adhesive tape having a first adhesion level of sufficient strength to cause the UV-sensitive adhesive tape to be firmly adhered to the bottom of the continuous carrier tape to thereby prevent de-lamination of the UV-sensitive adhesive tape from the continuous carrier tape during use; and (b) the top side of the continuous carrier tape having been subjected to a controlled amount of ultraviolet radiation so that only that portion of the UV-sensitive adhesive tape within each compartment was irradiated while the portion of the UV-sensitive adhesive tape which is affixed to the carrier tape was shielded from the ultraviolet radiation, to thereby reduce the adhesion level of the UV-sensitive adhesive tape within each compartment to a second lower level of adhesion.

Of course the present invention is not intended to be restricted to any particular form or arrangement, or any specific embodiment, or any specific use, disclosed herein, since the same may be modified in various particulars or relations without departing from the spirit or scope of the claimed invention hereinabove shown and described of which the apparatus or method shown is intended only for illustration and disclosure of an operative embodiment and not to show all of the various forms or modifications in which this invention might be embodied or operated.

What is claimed is:

1. A method for altering an adhesion level used to retain a component within one or more individual compartments of a continuous adhesive backed carrier tape, the method comprising the steps of:
   a. obtaining a continuous carrier tape of a given thickness and having a top side, a bottom side, and a multiplicity of individual separated compartments formed therein each extending from the top side to the bottom side and adhering a continuous UV-sensitive adhesive tape to the bottom side so that the continuous UV-sensitive adhesive tape covers the bottom of each of the compartments, the UV-sensitive adhesive tape having a first adhesion level of sufficient strength to cause the UV-sensitive adhesive tape to be firmly adhered to the bottom of the continuous carrier tape; and b. subjecting said top side of said continuous carrier tape to a controlled amount of ultraviolet radiation so that only that portion of the UV-sensitive adhesive tape within each compartment is irradiated while the portion of the UV-sensitive adhesive tape which is affixed to the carrier tape is shielded from the ultraviolet radiation, to thereby reduce the adhesion level of the UV-sensitive adhesive tape within each compartment to a second lower level of adhesion.

2. A method in accordance with claim 1 wherein the second lower level of adhesion is at a calibrated level minimized to enable retention of a component as placed on the irradiated UV-sensitive adhesive tape within a compartment yet enable removal without use of a lift mechanism to assist a pick tool.

3. The method in accordance with claim 1 wherein the first level of adhesion is at least 300 grams per square centimeter.

4. The method in accordance with claim 1 wherein the second level of adhesion is less than 50 grams per square centimeter.

5. The method of claim 1 wherein the method is applied to a first continuous adhesive backed carrier tape and is applied to a second continuous adhesive backed carrier tape, and wherein the controlled amount of ultraviolet radiation applied to the first continuous adhesive backed carrier tape is a first amount calibrated for a first small component and the controlled amount of ultraviolet radiation applied to the second continuous adhesive backed carrier tape is a second amount calibrated for a second small component.

6. A method for altering an adhesion level used to retain a component within one or more individual compartments of a continuous adhesive backed carrier tape, the method comprising the steps of:

a. obtaining a continuous carrier tape of a given thickness and having a top side, a bottom side, and a multiplicity of individual separated compartments formed therein each extending from the top side to the bottom side and adhering a continuous UV-sensitive adhesive tape to the bottom side so that the continuous UV-sensitive adhesive tape covers the bottom of each of the compartments, the UV-sensitive adhesive tape having a first adhesion level of sufficient strength to cause the UV-sensitive adhesive tape to be firmly adhered to the bottom of the continuous carrier tape;

b. indexing the UV-sensitive adhesive backed carrier tape through a tape punching mechanism to introduce at least one opening in the UV-sensitive adhesive tape in each compartment at a location where a component will be placed; and c. subjecting said top side of said continuous carrier tape to a controlled amount of ultraviolet radiation so that only that portion of the UV-sensitive adhesive tape within each compartment is irradiated while the portion of the UV-sensitive adhesive tape which is affixed to the carrier tape is shielded from the ultraviolet radiation, to thereby reduce the adhesion level of the UV-sensitive adhesive tape within each compartment to a second lower level of adhesion.

7. The method in accordance with claim 6 wherein the first level of adhesion is at least 300 grams per square centimeter.

8. The method in accordance with claim 6 wherein the second level of adhesion is less than 50 grams per square centimeter.

9. The method in accordance with claim 6 wherein the at least one opening is in a shape selected from the group comprising round, square, rectangular, wave, double wave, tooth shape and jagged.

10. A method for altering an adhesion level used to retain a component within one or more individual compartments of a continuous adhesive backed carrier tape, the method comprising the steps of:

a. obtaining a continuous carrier tape of a given thickness and having a top side, a bottom side, and a multiplicity of individual separated compartments formed therein each extending from the top side to the bottom side and adhering a continuous UV-sensitive adhesive tape to the bottom side so that the continuous UV-sensitive adhesive tape covers the bottom of each of the compartments, the UV-sensitive adhesive tape having a first adhesion level of sufficient strength to cause the UV-sensitive adhesive tape to be firmly adhered to the bottom of the continuous carrier tape;

b. subjecting said top side of said continuous carrier tape to a controlled amount of ultraviolet radiation so that only that portion of the UV-sensitive adhesive tape within each compartment is irradiated while the portion of the UV-sensitive adhesive tape which is affixed to the carrier tape is shielded from the ultraviolet radiation, to thereby reduce the adhesion level of the UV-sensitive adhesive tape within each compartment to a second lower level of adhesion; and c. indexing the UV-sensitive adhesive backed carrier tape through a tape punching mechanism to introduce at least one opening in the UV-sensitive adhesive tape in each compartment at a location where a component will be placed.

11. The method in accordance with claim 10 wherein the second level of adhesion is less than 50 grams per square centimeter.

12. The method in accordance with claim 10 wherein the at least one opening is in a shape selected from the group comprising round, square, rectangular, wave, double wave, tooth shape and jagged.

13. A method for altering an adhesion level used to retain a component within one or more individual compartments of a continuous adhesive backed carrier tape, the method comprising the steps of:

a. obtaining a continuous carrier tape of a given thickness and having a top side, a bottom side, and a multiplicity of individual separated compartments formed therein each extending from the top side to the bottom side, b. obtaining a perforated continuous UV-sensitive adhesive tape;

c. adhering the perforated continuous UV-sensitive tape to the bottom side so that the continuous UV-sensitive adhesive tape covers the bottom of each of the compartments, the UV-sensitive adhesive tape having a first adhesion level of sufficient strength to cause the UV-sensitive adhesive tape to be firmly adhered to the bottom of the continuous carrier tape; and d. subjecting said top side of said continuous carrier tape to a controlled amount of ultraviolet radiation so that only that portion of the UV-sensitive adhesive tape within each compartment is irradiated while the portion of the UV-sensitive adhesive tape which is affixed to the carrier tape is shielded from the ultraviolet radiation, to thereby reduce the adhesion level of the UV-sensitive adhesive tape within each compartment to a second lower level of adhesion.

14. The method in accordance with claim 13 wherein the openings are selected to thereby further reduce the resulting tape-to-component bond to a calibrated level minimized to enable retention of the component as placed yet enabling removal without use of a lift pin to assist a component pick tool.

15. The method in accordance with claim 13 wherein the first level of adhesion is at least 100 grams per square centimeter.

16. The method in accordance with claim 13 wherein the second level of adhesion is less than 50 grams per square centimeter.

17. A carrier tape comprising:
- a. a continuous carrier tape of a given thickness and having a top side, a bottom side, and a multiplicity of individual separated compartments formed therein each extending from the top side to the bottom side and adhering a continuous UV-sensitive adhesive tape to the bottom side so that the continuous UV-sensitive adhesive tape covers the bottom of each of the compartments, the UV-sensitive adhesive tape having a first adhesion level of sufficient strength to cause the UV-sensitive adhesive tape to be firmly adhered to the bottom of the continuous carrier tape; and
- b. that portion of the UV-sensitive adhesive tape within each compartment having a second lower level of adhesion.

18. The method in accordance with claim 17 wherein the first level of adhesion is at least 150 grams per square centimeter.

19. The method in accordance with claim 17 wherein the second level of adhesion is less than 50 grams per square centimeter.

20. The carrier tape in accordance with claim 17 further comprising at least one opening in the UV-sensitive adhesive tape located in each compartment.

21. The carrier tape in accordance with claim 20 wherein the at least one opening is in a shape selected from the group comprising round, square, rectangular, wave, double wave, tooth shape and jagged.

* * * * *